United States Patent [19]

Chung et al.

[11] Patent Number: 4,812,784
[45] Date of Patent: Mar. 14, 1989

[54] TEMPERATURE STABLE VOLTAGE CONTROLLED OSCILLATOR WITH SUPER LINEAR WIDE FREQUENCY RANGE

[75] Inventors: Paul W. Chung; Paik Saber, both of San Jose, Calif.

[73] Assignee: International Business Machines Corporation, Armonk, N.Y.

[21] Appl. No.: 123,024

[22] Filed: Nov. 19, 1987

[51] Int. Cl.[4] .............................................. H03K 3/281
[52] U.S. Cl. .................. 331/113 R; 331/144; 331/176
[58] Field of Search ............... 331/113 R, 144, 108 R, 331/111, 143, 176

[56] References Cited

U.S. PATENT DOCUMENTS

| | | | |
|---|---|---|---|
| 4,492,914 | 1/1985 | Hitomi | 331/113 R X |
| 4,621,240 | 11/1986 | Aluord et al. | 331/113 R |
| 4,717,892 | 1/1988 | Hitomi | 331/113 R |

OTHER PUBLICATIONS

Hanus et al, Stable Low Frequencies with FET-Bipolar Pairs, Electronics, Jan. 9, 1967, p. 105.
Christiansen, Multivibrator Sensitivity Improved by MOS FET's, Electronics, Dec. 11, 1967, p. 96.
Young, "Constant-Density Recording Comes Alive with New Chips", Electronic Design, Nov. 13, 1986, pp. 141-144.

Primary Examiner—Eugene R. LaRoche
Assistant Examiner—Robert J. Pascal
Attorney, Agent, or Firm—Simon K. Lee; Henry E. Otto, Jr.

[57] ABSTRACT

A voltage controlled oscillator (VCO) having high temperature stability and wide voltage/frequency linearity is provided. The VCO comprises a multivibrator being switched by a bipolar type device, and temperature fluctuations of the bipolar type means are compensated by a FET current source coupled thereto. To provide a linear relationship of frequency vs. voltage over wide voltage range, the bipolar device is further regulated by a plurality of resistor and diode networks.

9 Claims, 1 Drawing Sheet

TEMPERATURE STABLE VOLTAGE CONTROLLED OSCILLATOR WITH SUPER LINEAR WIDE FREQUENCY RANGE

The present invention relates to a voltage controlled oscillator having high temperature stability and a wide range of voltage/frequency linearity.

BACKGROUND OF THE INVENTION

In disk storage systems, sampling by a disk controller of readback signals representing stored data information requires synchronization of the controller's clock to data pulses communicated from the disk. In conventional disk storage subsystems, this synchronization is achieved using a voltage controlled oscillator (VCO) to continuously adjust the frequency. To provide constantly accurate synchronization, the frequency of the oscillator at a set voltage has to be stable over a wide temperature range. Furthermore, to improve the sampling capability of the controller, it is desirable to have a VCO that has a wide range of linear voltage vs. frequency relationship.

On the other hand, the present industrial trend of increasing storage device capacity through data banding and constant data density recording also requires an oscillator that has a wide linear range of frequency vs. voltage relationship. (See "Constant-Density Recording Comes Alive With New Chips", Electronic Design, Nov. 13, 1986, pp. 141-144).

However, both the frequency vs. voltage relationship and the temperature sensitivity of a semiconductor device are dictated by the characteristics of its constituents. Since the frequency vs. voltage relationship of semiconductor components follows the exponential and square laws, and since semiconductor components are sensitive to temperature changes, currently available semiconductor VCOs consequently can only operate within a narrow range of linear frequency vs. voltage relationship, and have a strong dependency on their operating temperatures.

In current manufacturing processes of disk storage devices, the above mentioned desired capabilities of VCOs are attained by laser trimming a VCO so that the center point of its linear frequency/voltage region coincides with the central operating frequency of the system. Laser trimming the VCOs, however, is a costly process.

It is an object of this invention to provide a voltage controlled oscillator which has high temperature stability.

It is also an object of this invention to provide a voltage controlled oscillator in which the voltage to frequency relationship remains linear over a wide frequency range.

SUMMARY OF THE INVENTION

In one aspect, the present invention is a voltage controlled oscillator having high temperature stability. The oscillator comprises a bipolar type means for switching a multivibrator; and a FET type current source coupled to said bipolar type means for compensating temperature fluctuations of said bipolar type means. The voltage controlled oscillator according to the present invention further includes resistive loads coupled to bipolar type diodes for regulating its current.

In another aspect, the present invention is a method for generating temperature-stable, voltage-controllable oscillating signals. The method comprising the steps of: switching a multivibrator with a bipolar means; and compensating temperature fluctuations of the bipolar means with a FET current source.

DESCRIPTION OF THE PREFERRED EMBODIMENT

Figure 1:
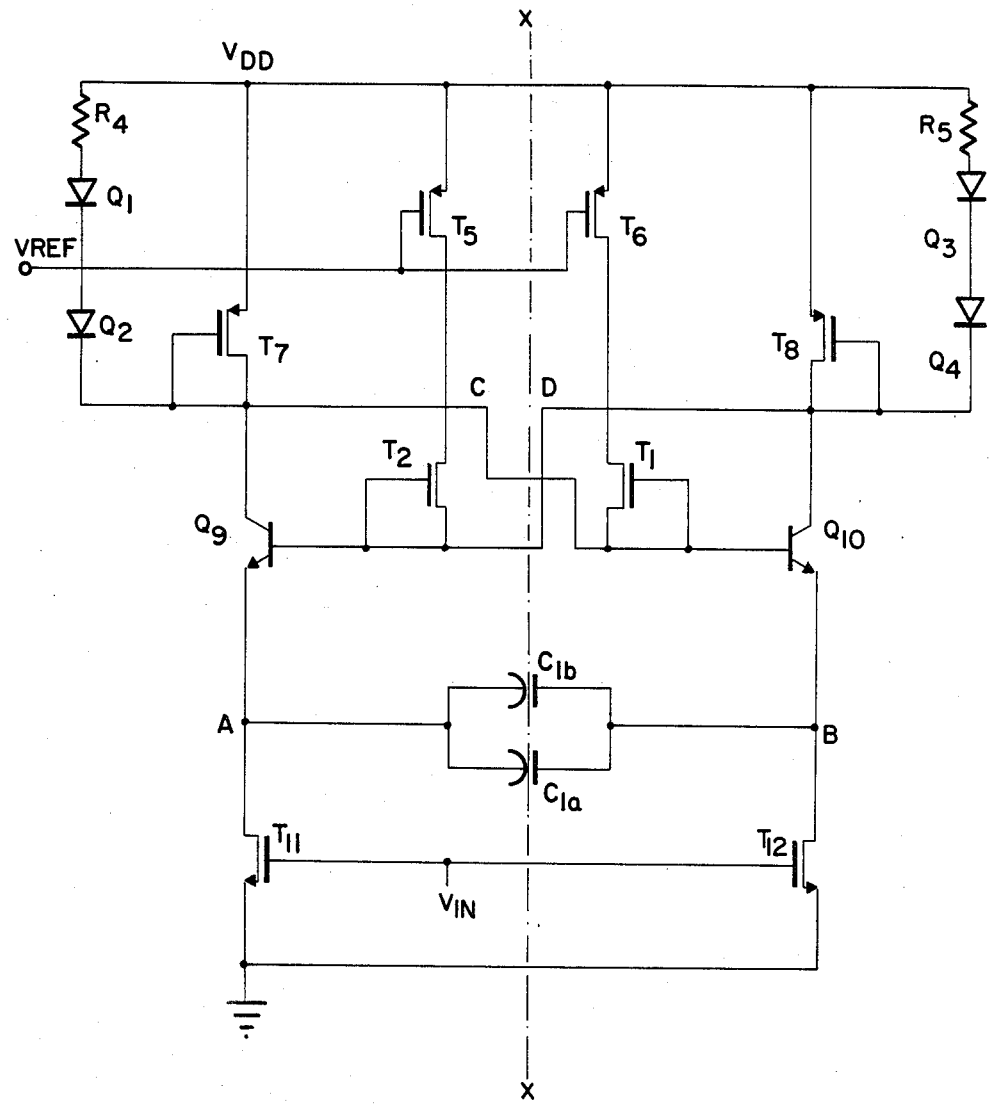
FIG. 1 is a schematic diagram of the voltage control oscillator according to the present invention.

Referring to FIG. 1, there is shown a schematic diagram of a voltage control oscillator (VCO) circuit according to the preferred embodiment of the present invention. Capacitors $C_{1b}$ and $C_{1a}$ are connected in parallel across nodes A and B with a combined capacitance of C. It will be understood by those skilled in the art that these two capacitors can be implemented as on chip Metal Oxide Seminconductor (MOS) capacitors and can also be replaced by one or more capacitors to provide the desired capacitance C across the nodes.

On each side of the capacitor pair $C_{1b}$ and $C_{1a}$ is a n-channel Field Effect Transistor (FET), $T_{11}$ and $T_{12}$ respectively, biased into saturation by input voltage Vin to provide a current source constantly draining the capacitors. Also connected to one side of the capacitor pair $C_{1a}$, $C_{1b}$ is the emitter of a bipolar transistor $Q_9$ and the other side of said pair is connected to a bipolar transistor $Q_{10}$ to provide a charging current to the capacitors.

Connected to the collector of transistor $Q_9$ is one or more networks each composed of a resistor, $R_4$, connected in series with one or more bipolar diodes, $Q_1$ and $Q_2$. Similarly, connected to the collector of transistor $Q_{10}$ is one or more serial combinations of resistor $R_5$ and one or more bipolar diodes, $Q_3$ and $Q_4$.

The operation of the circuit can be described by first assuming that bipolar transistor $Q_9$ is on and bipolar transistor $Q_{10}$ is off. Node C, to which is connected the collector of bipolar transistor $Q_9$, will be clamped at a voltage equal to a voltage drop across two bipolar diodes ($Q_1$ and $Q_2$) and a a voltage drop $I_4R_4$ below $V_{DD}$, $I_4$ being the current flowing through the resistor $R_4$.

The current through bipolar transistor $Q_9$ is greater than the discharge current of FET $T_{11}$. Consequently, this current charges the capacitor pair, $C_{1a}$ and $C_{1b}$, and raises the voltage of node A. This charging current, however, is regulated by the resistor $R_4$. A low threshold FET $T_1$ is provided across node D and the base of transistor $Q_{10}$ to clamp the voltage swing of node D. Similarly, a low threshold FET $T_2$ is provided across node C and the base of transistor $Q_9$ to clamp the voltage swing of node C. Clamping the voltages by these low threshold FETs improves the switching speed of the voltage across C and D, which is the output of the VCO.

With the low threshold of FET $T_2$ connected to the base and collector of transistor $Q_9$, the voltage across the base and collector of $Q_9$ will be clamped at the same voltage as the voltage drop across FET $T_2$. Similarly, with the low threshold FET $T_1$ connected to the base and collector of transistor $Q_{10}$, the voltage across the base and collector of $Q_{10}$ will be clamped at the same voltage as the voltage drop across FET $T_1$. This voltage drop across FET $T_2$ can be calculated by the current equation of the FET in saturation condition.

Diodes $Q_1$ and $Q_2$ regulate the current through resistor $R_4$. Similarly, diodes $Q_3$ and $Q_4$ regulate the current through resistor R$_5$. Since the charging current provided by each of current sources Q$_9$ and Q$_{10}$ passes respectively through R$_4$ and R$_5$, it follows the Ohm's law. Thus, wide linear frequency range of the VCO is achieved by replacing the exponential and the square law dependency of the current vs voltage relationship with a Ohm's law dependency.

While the voltage at node A is rising towards the voltage at node D minus a base-emitter voltage drop V$_{be}$ of transistor Q$_9$, the voltage at node B of the capacitor pair, being discharged by T$_{12}$, is falling towards ground. When the voltage at node B falls below a base-emitter voltage (V$_{be}$) drop below node C, Q$_{10}$ will turn on and Q$_9$ will turn off. Since the VCO circuit is symmetrical about line X—X, this toggling action repeats itself.

Loads T$_5$, T$_6$, T$_7$ and T$_8$ are used to established the operating voltage point of the oscillator.

When the operating temperature increases, the switching speed of the bipolar transistors, Q$_9$ and Q$_{10}$, will increase. However, the same increase in operating temperature will slow down FETs T$_{11}$ and T$_{12}$ which drain the current from the capacitors, thereby slowing down the switching speed. Thus, with any temperature changes, the change in speed due to the bipolar transistors Q$_9$ and Q$_{10}$ is offset by a corresponding change in rate of discharge by the FET current sources T$_{11}$ and T$_{12}$ in the opposite direction. Thus, the temperature sensitivity coefficients of the FET and BIPOLAR device complement each other.

Although the circuit is implemented with particular semiconductor device type, it will be understood by those skilled in the art that other devices having the same characteristics can be used. For example, p-channel FETs can be replaced by n-channel FETs in the circuits if corresponding changes on other parts of the circuits are made. Thus, while the invention has been described in the context of a preferred embodiment, it will be apparent to those skilled in the art that the present invention may be modified in numerous ways and may assume many embodiments other than that specifically set forth and described above, without departing from the spirit, scope and teaching of the invention.

We claim:

1. A voltage controlled oscillator having high temperature stability, comprising:
    a bipolar type means for switching a multivibrator;
    a FET type current source coupled to said bipolar type switching means for compensating temperature fluctuations of said bipolar type means;
    resistive means coupled to said bipolar type means for regulating its current to provide a linear frequency vs. voltage relationship; and
    a plurality of diodes coupled to said resistive means for regulating the current through said resistive means.

2. A voltage controlled oscillator as in claim 1, further comprising a plurality of FET type loads for establishing the output voltage of the oscillator.

3. A voltage controlled oscillator as in claim 1, further comprising means for limiting the output voltage swing of the multivibrator for improving the switching speed thereof.

4. A voltage controlled oscillator as in claim 3, wherein said limiting means is a low threshold FET.

5. A voltage controlled oscillator having high temperature stability, comprising:
    a multivibrator comprising:
    a capacitor;
    a bipolar type means for charging said capacitor;
    a FET type current source for compensating temperature fluctuations of said bipolar type current source;
    resistive means coupled to said multivibrator for regulating said bipolar type charging means to provide a linear frequency vs. voltage relationship; and
    a plurality of diodes coupled to said resistive means for regulating current therethrough.

6. A voltage controlled oscillator as in claim 5, further comprising a plurality of FET type loads coupled to said multivibrator for establishing the output voltage of the oscillator.

7. A voltage controlled oscillator as in claim 5, further comprising clamping means coupled to said multivibrator for limiting the output voltage swing of said multivibrator to improve the switching speed of the oscillator.

8. A voltage controlled oscillator as in claim 7, wherein said clamping means is a low threshold FET.

9. A method for generating temperature-stable, voltage-controllable oscillating signals, comprising the steps of:
    switching a multivibrator with a bipolar device;
    compensating temperature fluctuations of the bipolar current source with a FET current source;
    regulating said bipolar device by resistive means to provide a linear frequency vs. voltage relationship; and
    regulating current through said resistive means by connecting said resistive means in series with a plurality of diodes.

* * * * *